(12) United States Patent
Patapoutian et al.

(10) Patent No.: US 8,934,284 B2
(45) Date of Patent: Jan. 13, 2015

(54) METHODS AND APPARATUSES USING A TRANSFER FUNCTION TO PREDICT RESISTANCE SHIFTS AND/OR NOISE OF RESISTANCE-BASED MEMORY

(71) Applicant: Seagate Technology LLC, Cupertino, CA (US)

(72) Inventors: Ara Patapoutian, Hopkinton, MA (US); Ryan James Goss, Prior Lake, MN (US); Antoine Khoueir, Apple Valley, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 13/776,886

(22) Filed: Feb. 26, 2013

(65) Prior Publication Data

US 2014/0241032 A1 Aug. 28, 2014

(51) Int. Cl.
- *G11C 11/00* (2006.01)
- *G11C 11/56* (2006.01)
- *G11C 13/00* (2006.01)

(52) U.S. Cl.
CPC ............ *G11C 13/0002* (2013.01); *G11C 11/56* (2013.01)
USPC ............ 365/148; 365/163; 365/211; 365/206

(58) Field of Classification Search
CPC .............................. G11C 11/56; G11C 13/0002
USPC .................................. 365/148, 163, 206, 211
See application file for complete search history.

(56) References Cited

U.S. PATENT DOCUMENTS

| | | | |
|---|---|---|---|
| 6,967,867 B2 * | 11/2005 | Hamaguchi | 365/185.03 |
| 7,548,819 B2 * | 6/2009 | Slothers et al. | 702/57 |
| 7,639,522 B2 | 12/2009 | Cho et al. | |
| 7,768,811 B2 * | 8/2010 | Matsuno et al. | 365/145 |
| 7,859,893 B2 | 12/2010 | Liu et al. | |
| 8,023,345 B2 * | 9/2011 | Breitwisch et al. | 365/200 |
| 8,040,176 B2 * | 10/2011 | Ito | 327/540 |
| 8,040,723 B2 | 10/2011 | Sheu et al. | |
| 8,154,904 B2 * | 4/2012 | Sekar et al. | 365/148 |
| 8,238,185 B2 * | 8/2012 | Lee et al. | 365/211 |
| 8,300,444 B2 | 10/2012 | Nagashima et al. | |
| 8,547,735 B2 * | 10/2013 | Mizuguchi et al. | 365/163 |
| 8,659,966 B2 * | 2/2014 | Choi et al. | 365/211 |
| 2010/0165499 A1 | 7/2010 | Stipe | |
| 2012/0230085 A1 * | 9/2012 | Kawai et al. | 365/148 |
| 2013/0094294 A1 * | 4/2013 | Kwak et al. | 365/185.03 |
| 2013/0245869 A1 * | 9/2013 | Nishida et al. | 701/22 |

* cited by examiner

*Primary Examiner* — Viet Q Nguyen
(74) *Attorney, Agent, or Firm* — Hollingsworth Davis, LLC

(57) ABSTRACT

Two or more workload indicators affecting a memory cell of a resistance-based, non-volatile memory are measured. The two or more workload indicators are applied to a transfer function that predicts a resistance shift and/or resistance noise variance in response to the two or more workload indicators. A result of the transfer function is applied to shift and/or determine a threshold resistance used for at least one of a program operation and a read operation affecting the memory cell. An error rate of the memory cell is reduced as a result.

17 Claims, 5 Drawing Sheets

METHODS AND APPARATUSES USING A TRANSFER FUNCTION TO PREDICT RESISTANCE SHIFTS AND/OR NOISE OF RESISTANCE-BASED MEMORY

SUMMARY

The present disclosure is related to using a transfer function to predict resistance shifts of resistance-based memory. In one embodiment, methods and apparatuses facilitate measuring two or more workload indicators affecting a memory cell of a resistance-based, non-volatile memory. The two or more workload indicators are applied to a transfer function that predicts a resistance shift and/or resistance noise variance based on the two or more workload indicators. A result of the transfer function is applied to shift and/or determine a threshold resistance used for at least one of a program operation and a read operation affecting the memory cell. An error rate of the memory cell is reduced as a result.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

DETAILED DESCRIPTION

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the claims appended hereto.

The present disclosure is generally related to persistent data storage devices using resistance-based memory. Generally, resistance-based memory uses cells with resistance values that can be persistently altered to store data. A number of factors may cause short-term and long-term shifts in the cell's resistance values, leading to bit errors when data is read back. Apparatuses and methods are described below that can be used to predict, estimate, and compensate for resistance drifts and thereby reduce bit error rate.

Figure 1:
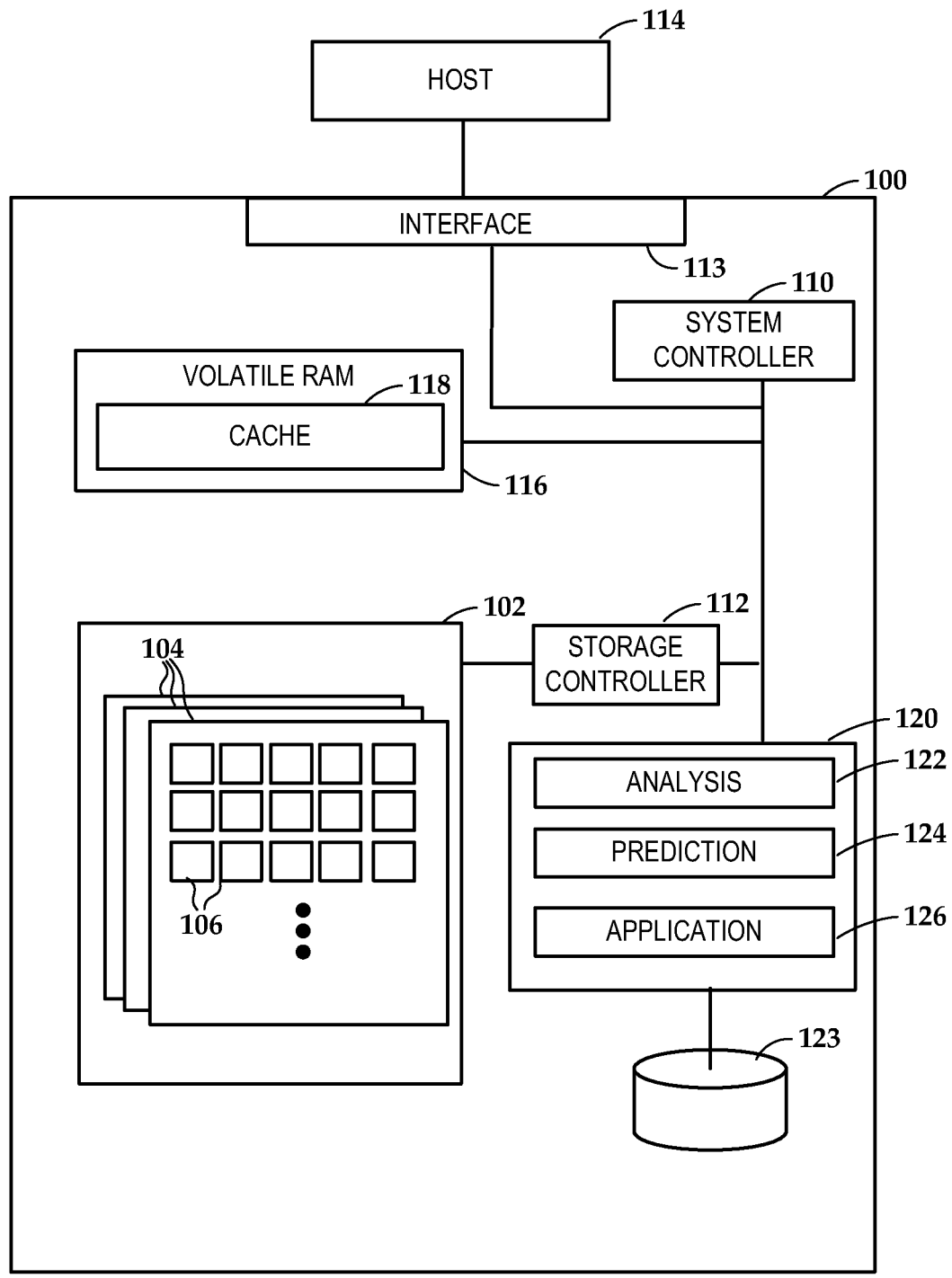
FIG. 1 is a block diagram of an apparatus according to an example embodiment.

In FIG. 1, a block diagram illustrates a data storage device 100 according to an example embodiment. This device 100 may be configured as a solid-state drive (SSD) (or sub-component thereof) that utilizes any combination of solid state memory. The features of the device 100 may be applicable to other types of hard drive devices, such as hybrid drives that use a combination of solid state memory and magnetic disks. The features of the device 100 may also be applicable to special-purpose solid-state and/or disk data storage devices (or sub-components thereof) that do not utilize standard hard drive data interfaces.

The device 100 may include one or more memory units 102 that contain some or all of the non-volatile memory of the device 100. The memory unit 102 may include one or more respective discrete physical units 104, e.g., memory chips. Within each of the physical units 104, the memory may be grouped into smaller blocks 106. While a single memory unit 102 is shown in this example, the concepts described herein may be employed in devices having more units of each different media types.

The device 100 may include one or more system controllers 110 that facilitate servicing requests received from a host 114 via a host interface 113. The system controller 110 generally receives read or write requests from the host 114 referencing logical addresses. The system controller 110 translates the logical addresses to physical addresses, and performs respective read or write operations on the appropriate physical addresses of the memory unit 102. The system controller 110 may direct a storage controller 112 to perform operations that affect the memory unit 102.

A storage controller 112 is a specialized controller that applies signals to perform reading and writing to the memory unit 102. The storage controller 112 may include analog-to-digital converters (ADCs) and digital-to-analog converters (DACs) that are used to apply signals to the memory blocks 106 and read data from the blocks 106. The storage controller 112 may include encoders and decoders, or encoding/decoding may be performed by a separate unit (not shown). If multiple memory units 102 are used, multiple storage controllers 112 may be employed to perform read/write operations appropriate for the particular memory type.

The device 100 may include volatile random access memory (RAM) 116 that may be used for, among other things, a volatile cache 118 for the non-volatile memory units 102, 103. Generally, the volatile cache 118 is a hierarchical memory structure that mirrors portions of the non-volatile memory 102, but can be read from and/or written to more quickly than the non-volatile memory 102. For some situations, e.g., data that sees repeated read/write activity over a short period of time, the volatile cache 118 will increase performance.

As previously noted, memory unit 102 includes resistive memory, e.g., ReRAM or PCM. Resistive memory uses memory elements (e.g., cells) that generally exhibit a predetermined resistance that can be shifted by the application of signals to the cells. For example, PCM cells change from an amorphous, crystalline, and intermediate states (and back again) upon the application of particular voltages, and the resistance is measurably different between those states. An RRAM cell includes a dielectric through which conductive paths can be formed/removed by the application of the appropriate voltage, which results in a variable resistance being detected through the dielectric.

A resistive memory cell may store one or more bits of data. If one bit is stored per cell, the value of the stored data is determined by measuring the resistance level of the cell and determining if it is above or below a defined threshold. Similarly, multiple bits can be stored by defining and detecting more than one threshold per cell. While multiple-bit cells can result in greater storage density, they may be more prone to error due to the need to more finely discern resistance measurements. Whether a resistive memory cell stores one bit or more than one bit, it may be susceptible to differences in how particular cells respond to programming voltages, neighboring activity, the passage of time, and other usage/environmental factors.

Resistive memory cells may exhibit variance in response to programming voltages due to manufacturing differences. Some of the variances can be accounted for by iterative programming, e.g., programming to a first level, reading back the resistance, and doing the same for subsequent programming levels until a target resistance is read back. However, there may be some cases where a cell drifts shortly after programming, e.g., due to thermal affects, and such drift may vary between cells. Over longer periods of time, the resistance levels of the memory cells may shift due to a number of factors, e.g., temperature, material breakdown, number of cycles, retention time, read/write disturb, neighboring data, etc. The cells may see other changes in response to these stimuli, such as increase in noise levels.

Resistance shifts and/or increased noise level of resistance memory cells can cause decreased reliability, e.g., requiring additional error correction measures or redundancy. These shifts may also affect endurance, e.g., data stored for long periods of time may exhibit significant bit error rate (BER) and/or become unreadable. These errors may become even more pronounced when the memory cell is used to store more than one bit. There are a number of ways to compensate for shifts in resistance and/or increases in noise, including adaptive error correction codes, modifying program and read behavior, using specific data storage formats, and active management of the media.

The present disclosure relates to methods, systems and apparatuses for predicting, estimating, and compensating for resistance drifts and/or noise levels to reduce bit error rate (BER). The impact of shifts in resistance and increased noise levels can be minimized by predicting and estimating the shift/noise and then compensating the optimal thresholds accordingly. As shown in FIG. 1, the storage device 100 includes functional modules 120 that facilitate reducing BER in a resistive-based, non-volatile memory. An analysis module 122 gathers data when reading from or writing to particular locations of the memory unit 102. The analysis module 122 may interface with the storage controller 112 to obtain data such as ADC values, noise margins, bit-errors, etc., and this data may be stored in a database 123.

A prediction module 124 correlates data gathered by the analysis module 122 in order to make predictions about current state of some or all of memory unit 102. The correlated data may be determined on the fly, or be stored in the database 123 at periodic intervals. An application module 126 applies the correlated prediction data in order to improve performance of the device 100. The application module 126 may look at two or more workload indicators determined by the analysis module 122 and/or prediction module 124 and determine a transfer function. The transfer function can be applied by the storage controller 112 when reading back data, compensating for expected resistance shifts and improving performance, e.g., lowering BER.

Figure 2:
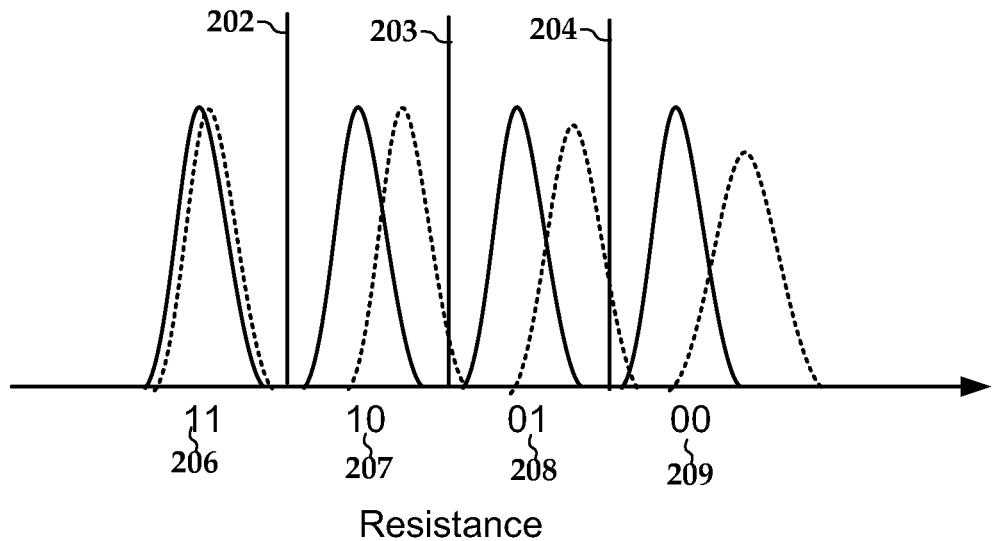
FIG. 2 is a block diagram illustrating resistance shifts in a multiple-level memory call according to an example embodiment.

In reference now to FIG. 2, a diagram illustrates an example of resistance shifts of a multiple-level resistance memory cell according to example embodiments. The horizontal axis represents resistance values measured from a population of cells. Threshold values 202-204 define four regions 206-209, each being associated with a data symbol stored in the cell. The four distributions drawn with solid lines represent an optimum distribution (e.g., resulting in minimum BER) and the four distributions drawn in dashed lines represent the effects of a resistance shift on all program levels. In this case, the shift results in an average increase in resistance, although shifts in the other direction may be possible. While this example is for a two-bit per cell MLC memory, the concepts are equally applicable for cells storing more or fewer bits per cell.

There are a number of ways that can be used to predict/estimate shifts in resistance. These approaches can be used together or individually. As shown in the block diagram of FIG. 3, a multivariate degradation/transfer function according to example embodiments can be used. The transfer function 300 can be calculated based on such parameters as time 302 (e.g., retention time and or total time of use), number of cycles 303, disturb 304 (e.g., neighboring read/write, neighboring data) and temperature 305. These input values 302-305 may be current and/or historical (e.g., accumulated values).

The transfer function 300 may take a number of forms depending on the type of output desired. As shown by block 308, the transfer function 300 may provide (or be used in providing) hard decision values, with the function $t_f(r)$ providing symbol value x, based on, e.g., shifted threshold based on some combinations of the inputs 302-305, as well as a baseline value, such as shown in FIG. 2. As shown by block 310, the transfer function 300 may provide (or be used in providing) soft decision values, such as a log-likelihood ratio of the function $t_f(r)$. In these functions 308, 310, the value r represents a value of resistance measured from the cell, and x represents the value of data stored in the cell.

Figure 3:
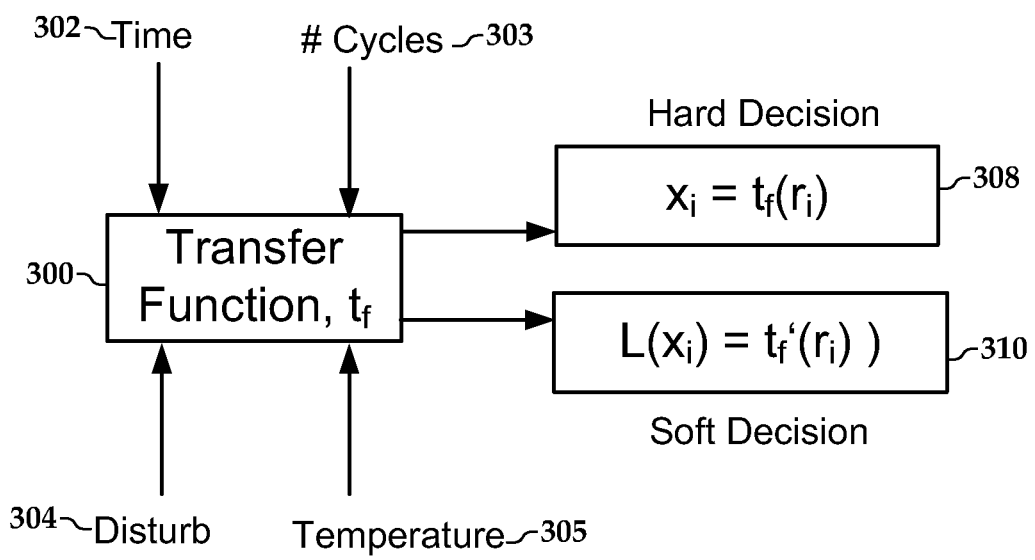
FIG. 3 is a block diagram illustrating a transfer function according to an example embodiment.

The transfer function 300 may also be used to predict noise level (e.g., variance) of the resistive memory cell instead of or in addition to resistance shifts (e.g., noise bias). For example, in reference again to FIG. 2, instead of the distributions being evenly shifted, the distributions may be unevenly shifted and/or unshifted, and the distributions themselves are broader (e.g., having larger standard deviation) indicating increase in random noise. So long as such deviations are predictable, they can be used to assist in decoding data as shown in FIG. 3. It will be understood that the methods and apparatuses described herein may utilize a transfer function to predict a resistance noise variance in response to the two or more workload indicators, and improve bit error rates using the transfer function.

Figure 4:
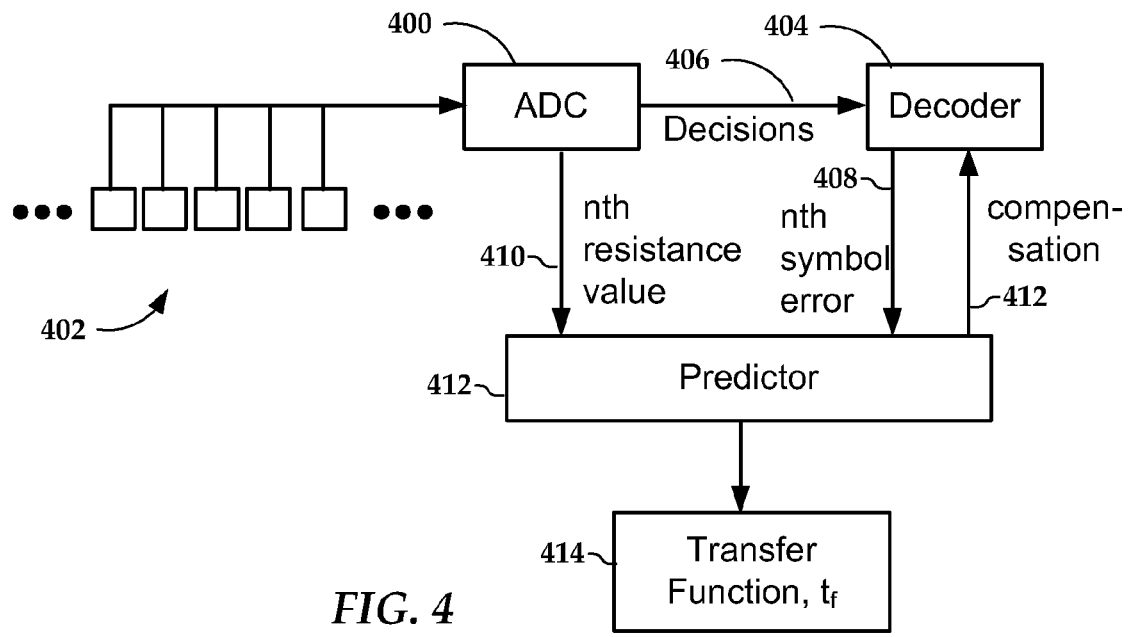
FIG. 4 is a block diagram illustrating the use of read errors to predict resistance shifts according to an example embodiment.

In reference now to FIG. 4, a block diagram illustrates concepts related to measurement of inputs to form a transfer function according to an example embodiment. An ADC 400 is configured to read a resistance value from memory cells 402. A decoder 404 uses data from the ADC 400 (either as soft or hard decision values 406) and decodes the data stored in the cells 402. The decoder 404 applies error correction when decoding the data, and this may result in determining one or more symbol errors 408. Soft information obtained from the state 406 of the current data can be used to predict the state of memory.

The symbol errors 408 and/or soft information 406 can be used by a predicting component 412 to predict resistance shift. For example, measuring Symbol-A→Symbol-B errors versus Symbol-B→Symbol-A errors can estimate the shift in resistance value and/or noise levels. The ADC 400 may be able to provide actual resistance values 410, e.g., using different thresholds. The ADC 400 may be configured to provide sample data 410 with thresholds of finer resolution and/or with multiple reads. An ADC can also be emulated from a single threshold by running it multiple times with different thresholds.

Figure 5:
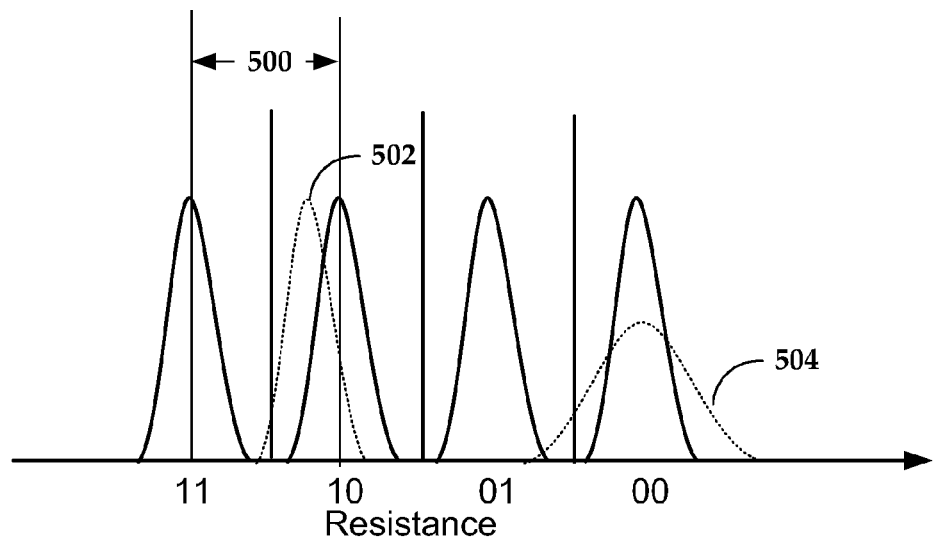
FIG. 5 is a block diagram illustrating noise margins in a multiple-level memory call according to an example embodiment.

The distribution of noise margin can be used to estimate resistance shift. Noise margin of a memory cell generally refers to the amount of noise that can be imposed on a memory cell before a change in state is induced by the noise. An example of noise margin for a multiple level cell is shown in FIG. 5. Value 500 is proportional to the noise margin. For example, the larger the distance 500 between the mean of neighboring resistance value distributions, the larger the noise margin. A decrease in noise margins may be indicative of resistance shift, as indicated by the shifted distribution 502. A decrease in noise margins may also be indicative of increased noise, as indicated by the shifted distribution 504 drawn with dashed lines. While the average value of distribution 504 is still about nominal, the greater standard deviation results in increased likelihood that noise will cause a change in a stored value.

Figure 6:
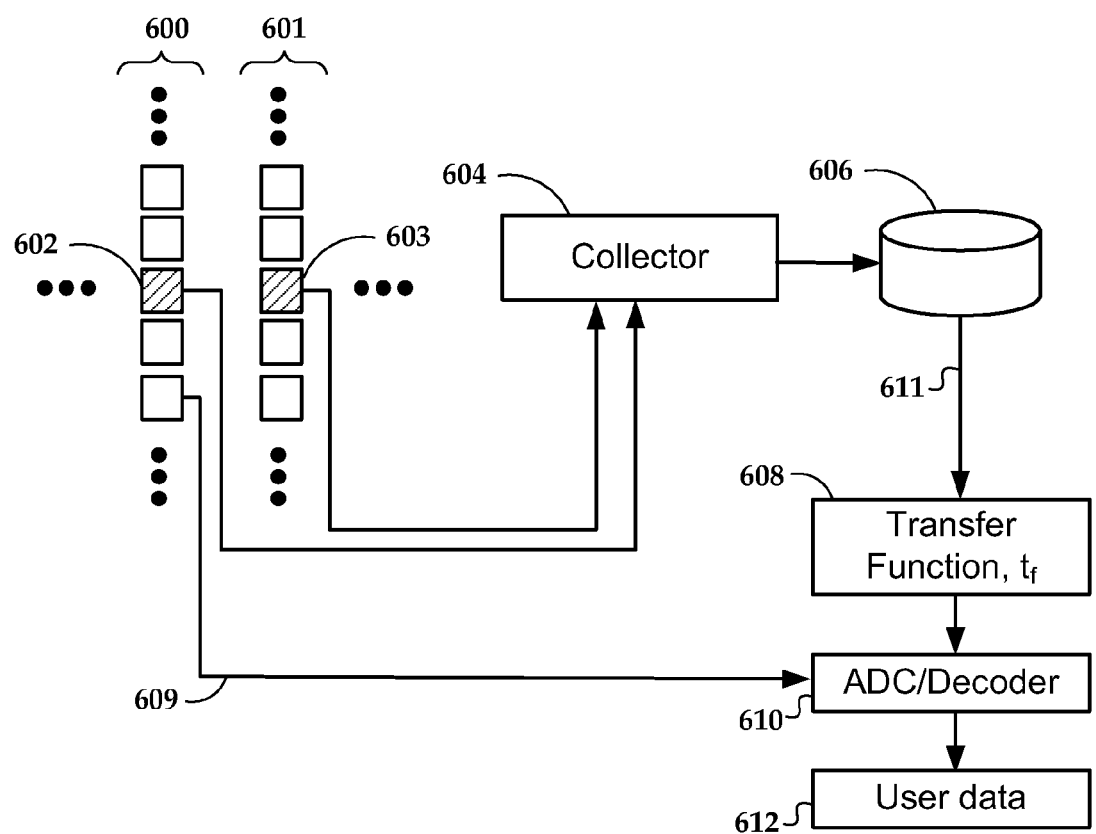
FIG. 6 is a block diagram illustrating the use of a reference cell to determine resistance shifts according to an example embodiment.

In reference now to FIG. 6, a block diagram illustrates the use of known data sets according to an example embodiment. Regions 600, 601 represent different regions of memory, such as layers, chips, etc. Blocks 602, 603 represent memory locations (e.g., individual cells, groups of cells, pages, etc.) within the regions 600, 601. The blocks 602, 603 store known data that can be used to characterize resistance shifts in the respective regions 600, 601. The known data in blocks 602, 603 may include predetermined patterns, data that can be looked up elsewhere, data that can be derived (e.g., based on an address of the cells, using counter or algorithm to generate sequences of data), and/or user data that has been stored with precautions to ensure it can be reliably retrieved (e.g., larger than normal ECC coding and/or redundancy).

A collector module 604 reads data from the blocks 602, 603 and determines a current amount of resistance shift in the blocks. The collector module 604 may perform this operation repeatedly, such as based on run time, calendar time, retention time, etc. The operations may be performed in response to some system event (e.g., threshold of bit-error rate) and/or in response to a user request. The collector module 604 may use data from an ADC and decoder as shown and described in FIG. 4 to determine resistance shift estimates. The value of the reference memory blocks 602, 604 may be read (e.g., via hardware support built into an ADC) at a higher resolution than other memory blocks.

The resistance shift data 606 can be used to lower errors on subsequent reads. For example, in response to read request 609 from region 600, resistance shift and/or noise data 611 is obtained from the database and used to form a transfer function 608 that may be applied via an ADC and/or decoder (represented together as block 610) to obtain user data 612. The resistance shift and/or noise data 611 may also include distribution of noise margin detected for the reference block or other blocks of the memory.

The data 611 input to the transfer function 608 may also include workload indicators particular to the cell or cells being read via the request 609, such as retention time, number of read cycles, number of write cycles, neighboring data values, and temperature. These workload indicators may be stored on the database 606 or elsewhere. For example, the workload indicators may be tracked via counters that are incremented when a certain event occurs, such as read/write cycle of the affected cell and/or neighboring cell, elapsed time, etc. Use hardware support may be used to automate resistance tracking.

Figure 7:
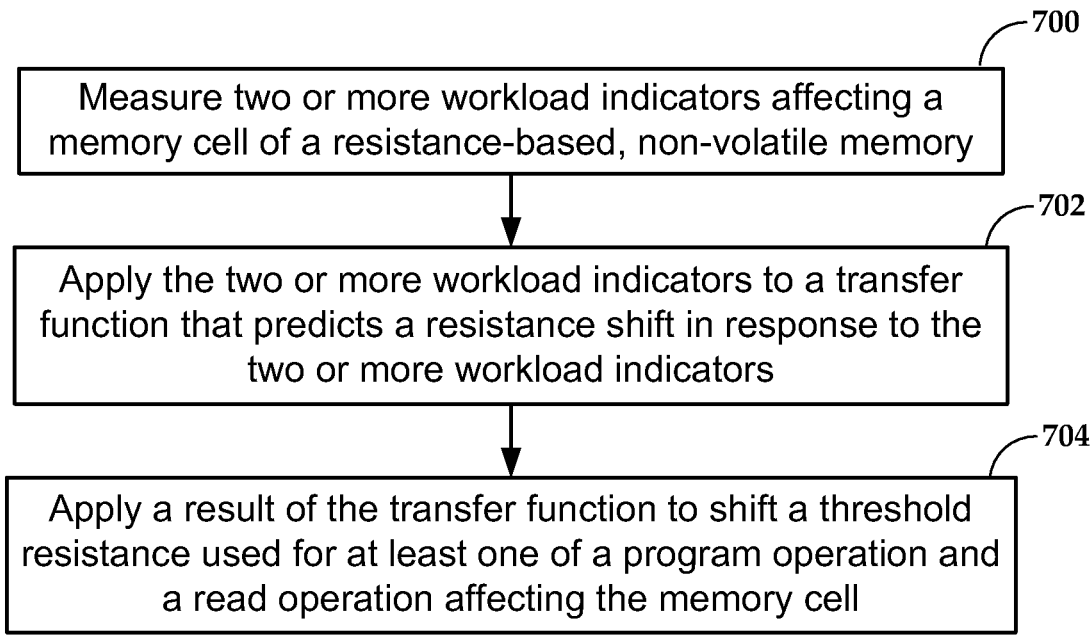
FIGS. 7 and 8 are flowcharts illustrating methods according to example embodiments.

In reference now to FIG. 7, a flowchart illustrates a method according to an example embodiment. The method involves measuring 700 two or more workload indicators affecting a memory cell of a resistance-based, non-volatile memory. The two or more workload indicators are applied 702 to a transfer function that predicts a resistance shift based on the two or more workload indicators. A result of the transfer function is applied 704 to shift a threshold resistance used for at least one of a program operation and a read operation affecting the memory cell. The shift reduces an error rate of the memory cell.

Figure 8:
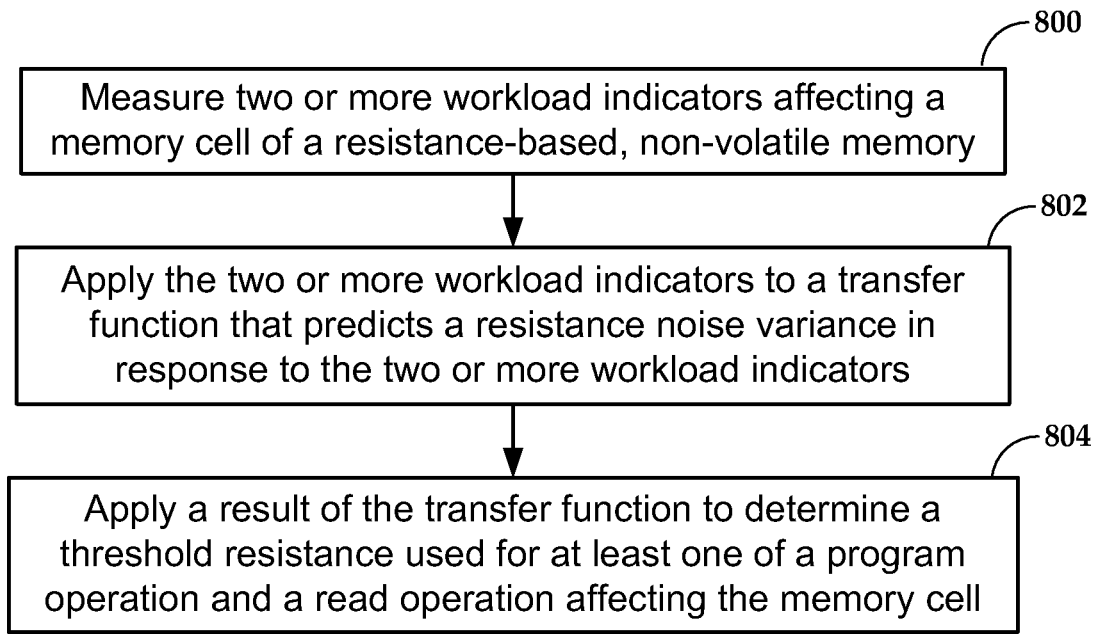

In reference now to FIG. 8, a flowchart illustrates a method according to an example embodiment. The method involves measuring 800 two or more workload indicators affecting a memory cell of a resistance-based, non-volatile memory. The two or more workload indicators are applied 802 to a transfer function that predicts a resistance noise variance in response to the two or more workload indicators. A result of the transfer function is applied 804 to determine a threshold resistance used for at least one of a program operation and a read operation affecting the memory cell. The threshold function reduces an error rate of the memory cell.

In the methods of FIGS. 7 and 8, the resistance-based, non-volatile memory may include phase change memory and/or resistive random access memory. The two or more workload indicators may include at least two of retention time, number of read cycles, number of write cycles, neighboring data values, and temperature. The transfer functions may be determined in response to reading a reference memory block of the resistance-based, non-volatile memory, the reference memory block storing a known data pattern. In such a case, reading of the reference memory block may involve reading the value of the reference memory block at a higher resolution than other memory blocks of the resistance-based, non-volatile memory. In such a case, the transfer function may be determined using a distribution of noise margin detected for the reference memory block.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create logic circuits or computer-readable instructions/code for execution by a processor. Such instructions may be stored on a computer-readable medium and transferred to the processor for execution as is known in the art. The structures and procedures shown above are only a representative example of embodiments that can be used to facilitate managing caching in data storage devices as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
measuring two or more workload indicators affecting a memory cell of a resistance-based, non-volatile memory;
applying the two or more workload indicators to a transfer function that predicts a resistance shift in response to the two or more workload indicators, wherein the two or more workload indicators comprise at least two of retention time, number of read cycles, number of write cycles, neighboring data values, and temperature; and applying a result of the transfer function to shift a threshold resistance used for at least one of a program operation and a read operation affecting the memory cell, wherein the shift reduces an error rate of the memory cell.

2. The method of claim 1, wherein the transfer function is determined in response to reading a reference memory block of the resistance-based, non-volatile memory, wherein the reference memory block stores a known data pattern.

3. The method of claim 2, wherein the reading of the reference memory block comprises reading the value of the reference memory block at a higher resolution than other memory blocks of the resistance-based, non-volatile memory.

4. The method of claim 2, wherein the transfer function is determined using a distribution of noise margin detected for the reference memory block.

5. The method of claim 1, wherein the resistance-based, non-volatile memory comprises at least one of phase change memory and resistive random access memory.

6. A non-transitory computer readable medium storing instructions executable by a processor to perform the method of claim 1.

7. An apparatus comprising:
a controller configured to be coupled to a resistance-based, non-volatile memory, the controller configured to cause the apparatus to perform:
measuring two or more workload indicators affecting a memory cell of the resistance-based, non-volatile memory;
applying the two or more workload indicators to a transfer function that predicts a resistance shift in response to the two or more workload indicators, wherein the two or more workload indicators comprise at least two of retention time, number of read cycles, number of write cycles, neighboring data values, and temperature; and
applying a result of the transfer function to shift a threshold resistance used for at least one of a program operation and a read operation affecting the memory cell, wherein the shift reduces an error rate of the memory cell.

8. The apparatus of claim 7, wherein the transfer function is determined in response to reading a reference memory block of the resistance-based, non-volatile memory, wherein the reference memory block stores a known data pattern.

9. The apparatus of claim 8, wherein the reading of the reference memory block comprises reading the value of the reference memory block at a higher resolution than other memory blocks of the resistance-based, non-volatile memory.

10. The apparatus of claim 8, wherein the transfer function is determined using a distribution of noise margin detected for the reference memory block.

11. The apparatus of claim 7, wherein the resistance-based, non-volatile memory comprises at least one of phase change memory and resistive random access memory.

12. An apparatus comprising:
a controller configured to be coupled to a resistance-based, non-volatile memory, the controller configured to cause the apparatus to perform:
measuring two or more workload indicators affecting a memory cell of the resistance-based, non-volatile memory;
applying the two or more workload indicators to a transfer function that predicts a resistance noise variance in response to the two or more workload indicators, wherein the two or more workload indicators comprise at least two of retention time, number of read cycles, number of write cycles, neighboring data values, and temperature; and
applying a result of the transfer function to determine a threshold resistance used for at least one of a program operation and a read operation affecting the memory cell, wherein the transfer function reduces an error rate of the memory cell.

13. The apparatus of claim 12, wherein the transfer function is determined in response to reading a reference memory block of the resistance-based, non-volatile memory, wherein the reference memory block stores a known data pattern.

14. The apparatus of claim 13, wherein the reading of the reference memory block comprises reading the value of the reference memory block at a higher resolution than other memory blocks of the resistance-based, non-volatile memory.

15. The apparatus of claim 13, wherein the transfer function is determined using a distribution of noise margin detected for the reference memory block.

16. The apparatus of claim 12, wherein the resistance-based, non-volatile memory comprises at least one of phase change memory and resistive random access memory.

17. The apparatus of claim 12, wherein the transfer function further predicts a resistance shift in response to the two or more workload indicators, and wherein applying the result of the transfer function to determine the threshold resistance comprises shifting the threshold resistance.

* * * * *